United States Patent
Truong et al.

(10) Patent No.: US 10,582,626 B2
(45) Date of Patent: Mar. 3, 2020

(54) CONVERGED INFRASTRUCTURE MANAGER

(71) Applicant: HEWLETT PACKARD ENTERPRISE DEVELOPMENT LP, Houston, TX (US)

(72) Inventors: Huong Truong, Houston, TX (US); Montgomery C. McGraw, Houston, TX (US); Thomas D. Rhodes, Houston, TX (US); Long B. Sam, Houston, TX (US); Kurt A. Manweiler, Houston, TX (US); Alex Olson, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/565,189

(22) PCT Filed: Apr. 29, 2015

(86) PCT No.: PCT/US2015/028322
§ 371 (c)(1),
(2) Date: Oct. 9, 2017

(87) PCT Pub. No.: WO2016/175799
PCT Pub. Date: Nov. 3, 2016

(65) Prior Publication Data
US 2018/0098441 A1 Apr. 5, 2018

(51) Int. Cl.
*H05K 5/00* (2006.01)
*G06F 1/20* (2006.01)
(Continued)

(52) U.S. Cl.
CPC ............. *H05K 5/0069* (2013.01); *G06F 1/20* (2013.01); *G06F 9/46* (2013.01); *G06F 13/4068* (2013.01); *G11C 5/04* (2013.01); *H05K 5/0065* (2013.01)

(58) Field of Classification Search
CPC .......... G06F 13/4068; G06F 1/20; G06F 9/46; G11C 5/04; H05K 5/0065; H05K 5/0069
See application file for complete search history.

(56) References Cited

U.S. PATENT DOCUMENTS 6,246,588 B1 * 6/2001 Kim ..................... H05K 1/141
361/786
6,313,984 B1 * 11/2001 Furay ................... G06F 1/1616
174/138 G
(Continued)

FOREIGN PATENT DOCUMENTS

JP 2008-171386 7/2008
JP 2012-503237 2/2012
WO WO-2014036135 3/2014

OTHER PUBLICATIONS

Flexpod Solutions, (Web Page), May 16, 2014, 2 Pages, http://www.netapp.com/in/solutions/flexpod.
(Continued)

*Primary Examiner* — James Wu
(74) *Attorney, Agent, or Firm* — Nolte Intellectual Property Law Group

(57) ABSTRACT

A converged infrastructure manager comprises a circuit board, a processor connected to a first side of the circuit board, a solid state drive connected to the circuit board, a first connector extending from the first side of the circuit board, a second connector extending from a second side of the circuit board, a first dual in-line memory module con- (Continued)

nected to the first connector and a second dual in-line memory module connected to the second connector.

14 Claims, 3 Drawing Sheets

(51) Int. Cl.
    *G06F 9/46*     (2006.01)
    *G11C 5/04*     (2006.01)
    *G06F 13/40*     (2006.01)

(56) References Cited

U.S. PATENT DOCUMENTS

| | | | |
|---|---|---|---|
| 8,248,782 B2* | 8/2012 | Tanaka | G06F 1/20 361/679.48 |
| 2008/0158956 A1 | 7/2008 | Im | |
| 2008/0170362 A1* | 7/2008 | Micewicz | G11B 25/043 361/679.33 |
| 2008/0180899 A1 | 7/2008 | Pearson et al. | |
| 2009/0273898 A1* | 11/2009 | Imsand | G06F 1/181 361/679.39 |
| 2010/0172078 A1* | 7/2010 | Tanaka | G11B 33/142 361/679.5 |
| 2014/0071616 A1* | 3/2014 | Watanabe | H05K 7/20736 361/679.47 |
| 2016/0306764 A1* | 10/2016 | Mundt | G06F 13/4027 |

OTHER PUBLICATIONS

ICC NovaSery solutions powered by Intel® Xeon® E3 v3 "Haswell" and Intel® Xeon® E5 v2 "Ivy Bridge-EP" CPUs: optimized for hosting, cloud, and the modem data center!, (Research Paper), Sep. 13, 2013, 8 Pages.

Kerner, S.M., Dell Debuts PowerEdge VRTX for Converged Infrastructure, (Web Page), Jun. 5, 2013, 3 Pages, http://www.serverwatch.com/server-news/dell-debutspoweredge-vrbc-for-converged-infrastructure.htm.

VBLOCK Systems Overview, (Web Page), Feb. 21, 2013, 2 Pages, http://www.vce.com/products/vblock/overview.

\* cited by examiner

CONVERGED INFRASTRUCTURE MANAGER

BACKGROUND

Some converged infrastructures operate by grouping multiple information technology components into enclosures, such as racks. Components of a converged infrastructures may include servers, data storage devices, networking equipment and infrastructure managers.

DETAILED DESCRIPTION OF EXAMPLES

Figure 1:
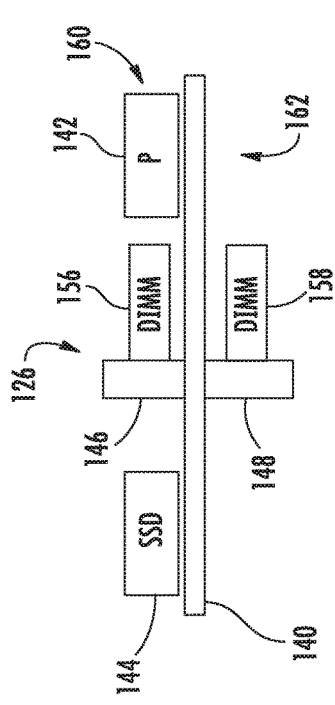
FIG. 1 is a schematic diagram of an example converged infrastructure management system.

FIG. 1 schematically illustrates an example converged infrastructure management system 20. Management system 20 utilizes an infrastructure manager to control and manage a variety of multiple components of a converged infrastructure that may be contained in racks or enclosures. Examples of such components include, but are not limited to, servers, data storage devices and networking equipment.

Management of infrastructure components is sometimes carried out by management hardware that is often bulky, occupying valuable enclosure real estate. In many instances, the hardware and associated software for managing converged infrastructures are inadequate for high-level management functions. In many instances, the hardware and associated software for managing converged infrastructures is distributed amongst multiple boards or external servers, necessitating multiple installations and configurations.

In contrast, system 20 utilizes an infrastructure manager having a hardware architecture that carries out high-level management functions while being contained in a single compact appliance. As a result, the small form factor appliance has low cost and conserves data center space. In one implementation, the hardware architecture of the infrastructure manager is sufficiently compact such that the infrastructure manager may be located within the cooling duct or plenum of a rack or enclosure, allowing the space previously occupied by the infrastructure manager to be utilized for other components.

System 20 may include enclosures 24A, 24B . . . 24N (collectively referred to as enclosures 24 and converged infrastructure managers 26. Each of enclosures 24 may include a housing or rack 27, a cooling duct or plenum 28, components 30 and an enclosure manager 32. Rack 27 may include a framework that supports each of components 30 and enclosure manager 32. In the example illustrated, rack 27 may include multiple docks or bays 34 that receive components 30 and enclosure manager 32. Components 30 comprise servers, data storage devices and/or networking equipment. Cooling duct or plenum 28 may include an air passage through which air is blown or drawn to cool components 30 and enclosure manager 32. Enclosure manager 32 manages the components of the individual associated enclosure 24.

Converged infrastructure managers 26 are similar to one another, providing redundancy in case of failure of one of managers 26. Each infrastructure manager 26 communicates with the enclosure manager 32 of each of enclosures 24. In the example illustrated, each infrastructure manager 26 comprise a port 29 that facilitates communication with another enclosure manager of a different enclosure. In the example illustrated, each infrastructure manager 26 is X86 instruction set compatible (compatible with a family of instruction set architecture is based on the Intel 8086 CPU and its Intel 8088 variant). In the example illustrated, each of managers 26 has at least 16 GB of memory, having sufficient memory to provide server-class management functions. At the same time, while offering server class management functions, each converged infrastructure manager 26 occupies very little space. Each converged infrastructure manager 26 has an architecture or arrangement of internal components allow manager 26 to have an outer profile with a width of less than or equal to 3.25 inches, a length of less than or equal to 22 inches and a thickness of less than or equal to 0.9 inches. As illustrated by FIG. 1, this small form factor facilitates locating and containing each of managers 26 in plenum 28 of one of enclosures 24, rather than occupying actual component bays 34. In other implementations, managers 26 are provided at other locations within or on the associated enclosure 24.

Figure 2:
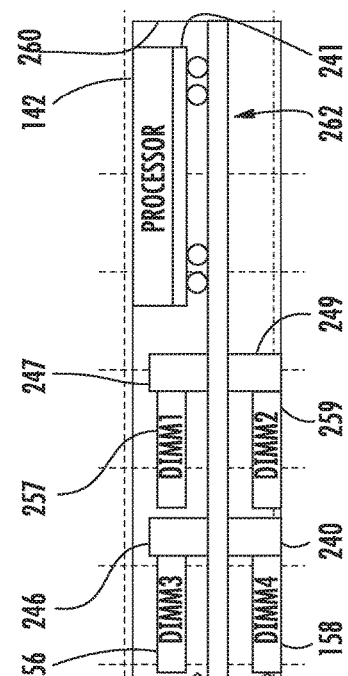
FIG. 2 is a side view of an example converged infrastructure manager of the system of FIG. 1.

FIG. 2 schematically illustrates an individual converged infrastructure manager 126, one example of manager 26 shown in FIG. 1. As will be described hereafter, infrastructure manager 126 has an architecture which locates dual in-line memory modules both above and below a circuit board to facilitate a reduction in size of manager 126. FIG. 2 is a side view of manager 126. Like manager 26, manager 126 is X86 instruction set compatible (compatible with a family of instruction set architecture is based on the Intel 8086 CPU and its Intel 8088 variant) and has at least 16 GB of memory, providing server-class management functions. Like infrastructure manager 26, manager 126 has a small compact form factor, having an outer profile with a width of less than or equal to 3.25 inches, a length of less than or equal to 22 inches and a thickness of less than or equal to 0.9 inches.

As schematically shown by FIG. 2, manager 126 may include a circuit board 140, processor 142, solid state drive 144, connectors 146, 148 and dual in-line memory modules 156, 158. Circuit board 140 comprise a board having various electronic components and logical interconnects or traces providing a bus by which processor 142, solid-state drive 144 and dual in-line memory modules 156, 158 communicate.

Processor 142 may include a processing unit to carry out management functions for enclosures 24 (shown in FIG. 1) following instructions contained in a non-transitory computer-readable medium. Processor 142 is secured to side 160 of circuit board 140. In one implementation, processor 142 secured via a socket. In one implementation, processor 142 may include a Haswell socket processor, a processor microarchitecture developed by Intel. Use of a socket processor facilitates lower costs for manager 126, while offering flexibility, being able to accept a processor 142 in the form of INTEL CORE i3, i5 and E3 processors. In other implementations, manager 126 may comprise other types of processors for processor 142.

Solid-state drive (SSD) 144, also referred to as a solid-state disk, may include a flash-based, DRAM based or other solid-state storage device secured to side 160 of circuit board 140. In one implementation, solid-state drive may include an ultrathin 7 mm solid-state drive.

Connectors 146, 148 are secured to an extend from opposite sides of circuit board 140. Connector 146 extends from and on side 160 of circuit board 140 while connector 148 extends from and on side 162 of circuit board 140. Connectors 146, 148 facilitate releasable connection of dual in-line memory modules 156, 158.

Dual in-line memory modules 136, 158 (DIMMs) comprise dynamic random access memory integrated circuits. Dual in-line memory models 136, 138 are plugged into connectors 146, 148. Because connectors 146, 148 extends from opposite sides 160, 162 of circuit board 140 and facilitate connection of dual in-line memory models 156, 158, extending parallel to circuit board 140 on opposite sides of circuit board 140, manager 126 is a writer with a larger amount of memory in a smaller volume to provide manager 126 with a smaller form factor.

Figure 3:
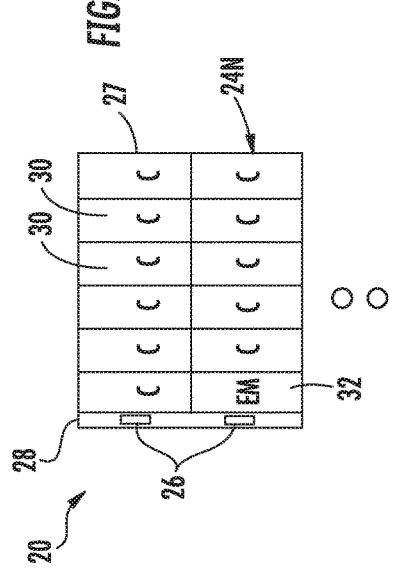
FIG. 3 is a side view of another example converged infrastructure manager of the system of FIG. 1.
Figure 3:
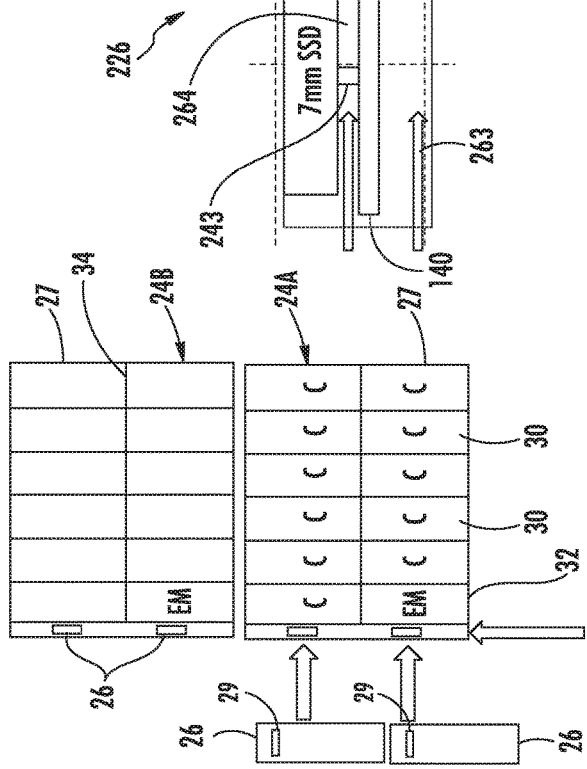

FIG. 3 is a side view illustrating an individual converged infrastructure manager 226, another example of manager 26 shown in FIG. 1. Like manager 126, manager 226 has an architecture that facilitates a reduction in size of manager 126. As will be described with respect to the illustrated example, manager 226 facilitates the reduction in size by locating dual in-line memory modules both above and below a circuit board, by locating the dual in-line memory modules end-to-end with respect to a processor and by using a via and wiring layout that enhances signal quality. FIG. 2 is a side view of manager 126. Like manager 26, manager 226 is X86 instruction set compatible (compatible with a family of instruction set architecture is based on the Intel 8086 CPU and its Intel 8088 variant) and has at least 16 GB of memory, providing server-class management functions. Like infrastructure manager 26, manager 226 has a small compact form factor, having an outer profile with a width of less than or equal to 3.25 inches, a length of less than or equal to 22 inches and a thickness of less than or equal to 0.9 inches.

Manager 226 may include circuit board 140, socket 241, processor 142, standoffs 243, solid state drive 144, first side connectors 246, 247, second side connectors 248, 249 and dual in-line memory modules 156, 257, 158 and 259. Circuit board 140, processor 142 and solid-state drive 144 are described above with respect to manager 126.

Socket 241 may include a socket connected to side 260 of circuit board 140 to removably receive processor 142 (described above). In the example illustrated, socket 241 facilitates connection of a Haswell socket processor. Socket 241 provides flexibility, facilitating removable or releasable connection to a processor 142 in the form of INTEL CORE i3, i5 and E3 processors. In other implementations, manager 126 may comprise other types of processors for processor 142.

Standoffs 243 (schematically illustrated as a block in FIG. 3) comprise posts, columns other supports that elevate solid-state drive 144 (described above) sources spaced solid-state drive 144 from circuit board 140. As indicated by arrows 263, the elevation of solid-state drive 144 facilitates airflow between solid-state drive 144 and circuit board 142 facilitate cooling of solid-state drive 144 as well as dual in-line memory modules 156 and 257 each of which is located on side 260 of circuit board 140. The air gap 264 provided between circuit board 140 and solid-state drive 144 further facilitates airflow 263 to processor 142 to facilitate cooling a processor 142. When located within plenum 28 (shown in FIG. 1), air from plenum 28 may flow through manager 226 to cool the components of manager 226. In one implementation, standoffs 243 space solid-state drive 144 by a distance of between 3 and 4 mm to facilitate sufficient airflow without substantially increasing the form factor of manager 226. In other implementations, standoffs 243 may have other heights or may be omitted.

Connectors 246, 247 are similar to connector 146 described above. Connector 246, 247 are connected to and extend from side 260 of circuit board 140. Connectors 246, 247 includes sockets to removably receive plug-in dual in-line memory modules 156, 257, respectively. Connectors 246, 247 extend from circuit board 140 such that connector 247 is horizontally sandwiched between processor 142 and connector 246. In the example illustrated, each of connectors 246, 247 may include a 5.2 mm high connector, providing airflow below the supported memory modules 156, 257.

Connectors 248, 249 are similar to connector 148 described above. Connector 248, 249 are connected to and extend from side 262 of circuit board 140. In the example illustrated, connector 248 extends directly opposite to connector 2460 connector 249 extends directly opposite to connector 247. Connectors 248, 249 extend from circuit board 140 such that connector 249 is horizontally closer approximate to socket 241 and processor 142 as compared to connector 248. In the example illustrated, each of connectors 248, 249 may include a 2 mm high connector, extending closer to circuit board 140 to reduce the height or thickness of manager 226.

In one implementation, manager 226 serves as a plug-and-play appliance. Manager 26 manages all entities in its associated enclosure 24 (shown in FIG. 1). Manager 226 further communicates with each enclosure manager 32. In one implementation, such communication with the multiple enclosure managers is through a 10G MC (10 GB network interface controller or network interface card) port. In one such implementation, an iLO sideband multiplexes with the 10G MC to facilitate a second manager 226 to communicate with embedded server management technology such as Integrated Lights-Out (iLo). In one implementation, such embedded management technology facilitates activities on components from a remote location such as resetting a server, powering up a server, remote counsel, access to a server's integrated management log or the like. The enclosure managers 32 communicate with the converged infrastructure manager 226 iLo through a serial console. In other implementations, each enclosure manager 32 may also perform some low-level control of manager 226 via CANmic sideband signals. CANmic is a serial bus protocol similar to I2C but which has fault tolerance.

Overall, manager 226 provides full-service enclosure management with a compact architecture that reduces the size of manager 226, conserving valuable real estate in a rack or enclosure for other components of a converged infrastructure. In one implementation, processor 142 carries out an integrated infrastructure systems management functions, such as the management of servers, enclosures, fabrics, storage through templates and profiles, the management of virtual machines and clouds, stateless servers and OS Provisioning and other embedded management nodes, are each integrated into our carried out by a single manager and a single appliance, as compared to a distributed across multiple separate appliances, such as an onboard administrator and an external server, which occupy valuable enclosure real estate.

Figure 4:
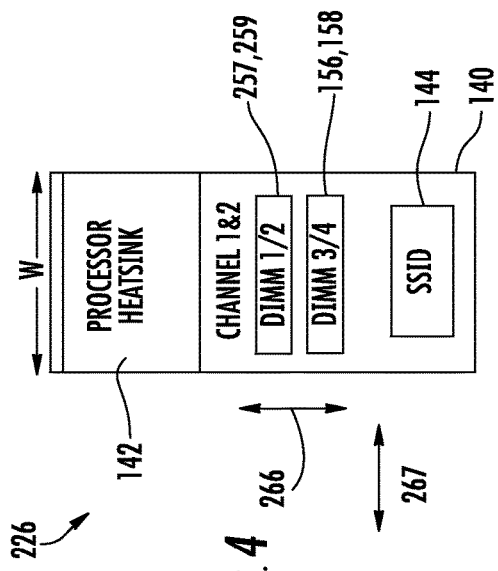
FIG. 4 is a top view of the converged infrastructure manager of FIG. 3.

FIG. 4 is a top view of a portion of manager 226. As shown by FIG. 4, each of connectors 246, 247, 248, 249 and the supported dual in-line memory modules 156, 257, 158, 259 (schematically illustrated) have a width that is less than the width of processor 142. In the example illustrated, the overall width of manager 126 is dependent upon the width of processor 142. In the example illustrated, because processor 142 has a width of less than or equal to 3.25 inches, manager 226 may be provided with a width of less than or equal to 3.25 inches. Because the connectors and their dual in-line memory modules 257, 259 and 156, 158 are stacked relative to one another in the direction indicated by arrows 266 (in contrast to the direction indicated by arrows 267), manager 226 maintains a compact form factor.

To facilitate such vertical stacking of connectors 247, 249 and connector 246, 248 and their associated memory modules, routing of memory between the connectors that are on top of each other in their associated dams, connectors 247, 249 in their memory modules 257, 259 as well as connectors 246, 248 and their memory modules 156, 158 is a T-topology, in contrast to a daisy-chain topology. In other words, to memory channels are lumped together, with one T-topology for memory models 156, 158 in a first channel and a second T-topology for memory modules 257, 259 in a second channel. In the example illustrated, the T-topology may include a memory trace from processor 142 that splits into T shape at a via where each branch of the T is connected to a DIMM 156, 257, 158, 259.

As shown by FIGS. 3 and 4, the layout or arrangement of connectors 246, 247, 248, 249 and their associated memory modules 156, 257, 158, 259 results in connector 246, 248 and their memory models 156, 158 being horizontally spaced further from processor 142 as compared to connectors 247, 249 and memory modules 257, 259. To facilitate enhanced signal quality, despite the distant positioning of connectors 246, 248 and memory models 156, 158 from processor 142, each memory signal via in circuit board 140 is interleaved with ground stitching vias.

Figure 6:
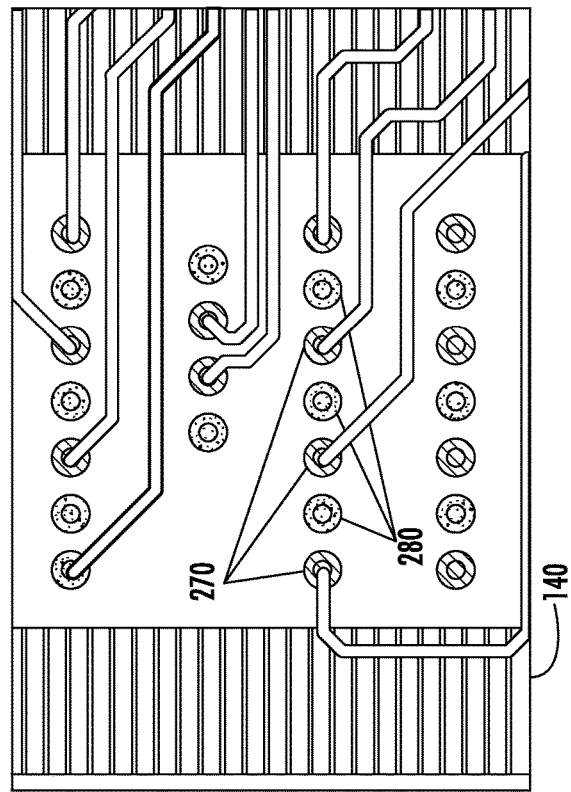
FIG. 6 is an enlarged view of the portion of the circuit board of FIG. 5.
Figure 5:
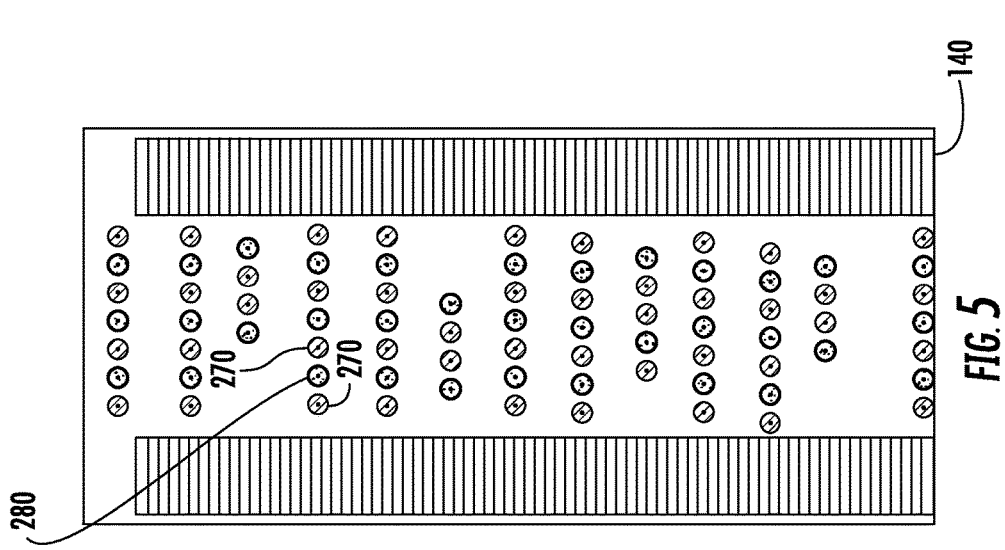
FIG. 5 the top view of a portion of a circuit board of the manager of FIG. 3 at a memory module side of the circuit board.
Figure 7:
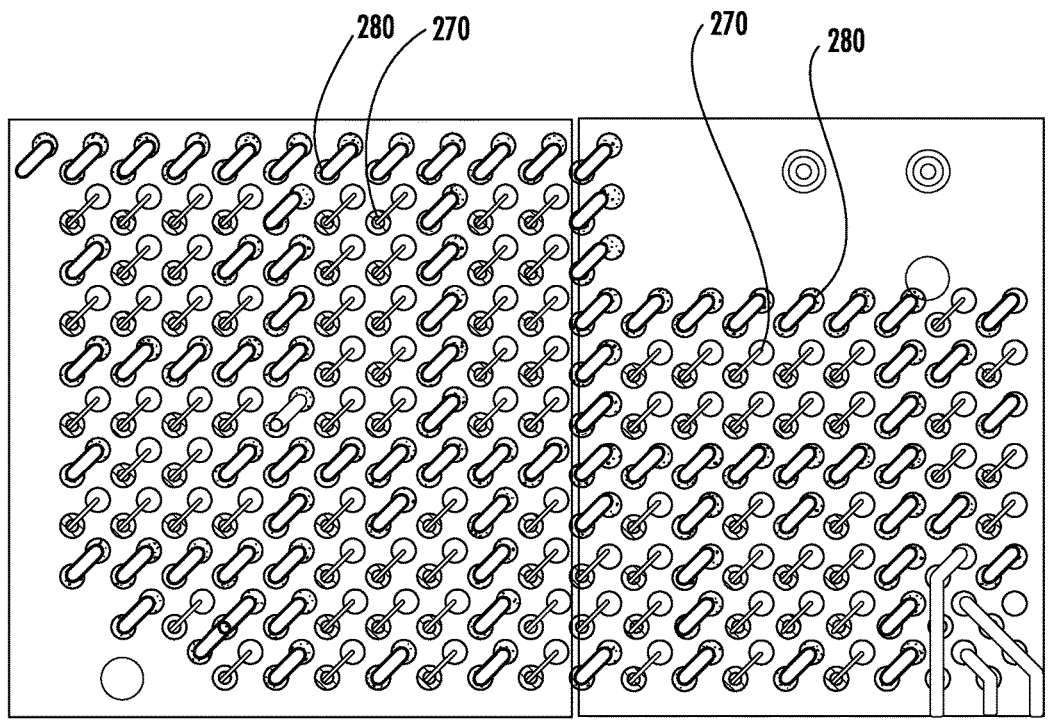
FIG. 7 is a top view of a portion of the circuit board of 5 of the manager of FIG. 3 at a processor side of the circuit board.

FIGS. 5-7 illustrate an example layout of memory vias and ground stitching vias. FIGS. 5 and 6 illustrate the interleaving of memory signal vias 270 (illustrated with hatching) with ground stitching vias 280 (illustrated with stippling) at the DIMM side. FIG. 7 illustrates a breakout and via arrangement at the processor side, wherein each memory signal via 270 is surrounded by ground vias 280. The patterning of such vias facilitates enhanced signal quality.

Figure 8:
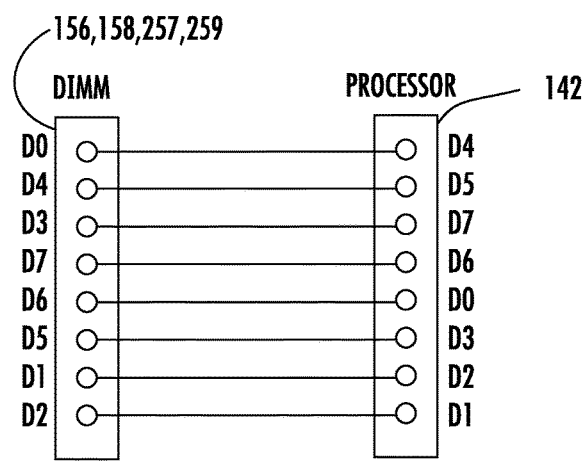
FIG. 8 is a schematic diagram illustrating data group or pin swapping between a memory module and the processor of the manager of FIG. 3.

FIG. 8 illustrates swapping of pins at each memory module 156, 158, 257, 259 with respect to processor 142. In the example illustrated, eight data groups form 64-bit data. All eight data groups are swapped to facilitate smooth connections between the processor and memory modules to maintain the via pattern shown in FIGS. 5-7 while reducing the extent to which routing of such connection is twisted. For example, pin D0 of a memory module is connected to pin D4 of processor 142, rather than pin P0 of processor 142. Other similar swappings are made to facilitate straight connections.

Although the present disclosure has been described with reference to example implementations, workers skilled in the art will recognize that changes may be made in form and detail without departing from the spirit and scope of the claimed subject matter. For example, although different example implementations may have been described as including one or more features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements.

What is claimed is:

1. A converged infrastructure manager comprising:
   a circuit board;
   a processor connected to a first side of the circuit board;
   a solid state drive connected to the circuit board, wherein the solid-state drive is spaced from the circuit board by an air gap of at least 3 mm extending from the solid-state drive to the circuit board;
   a first connector extending from the first side of the circuit board;
   a second connector extending from a second side of the circuit board;
   a first dual in-line memory module connected to the first connector;
   a second dual in-line memory module connected to the second connector;
   a third connector extending from the first side of the circuit board between the processor and the first connector;
   a fourth connector extending from the second side of the circuit board directly below the third connector;
   a third dual in-line memory module connected to the third connector; and
   a fourth dual in-line memory module connected to the fourth connector, wherein the processor has a width and wherein the first dual in-line memory module, the second dual in-line memory module, the third dual in-line memory module and the fourth dual in-line memory module are stacked in a direction perpendicular to the width of the processor and have a collective footprint width that is less than the width of the processor, such that a width of the converged infrastructure manager is no wider than the width of the processor.

2. The converged infrastructure manager of claim 1, wherein the circuit board comprises a memory bus comprising memory signal vias and ground vias, wherein the memory signal vias are interleaved with the ground vias.

3. The converged infrastructure manager of claim 2 having an outer profile with a width of less than or equal to 3.25 inches, a length of less than or equal to 22 inches and a thickness of less than or equal to 0.9 inches.

4. The converged infrastructure manager of claim 3, wherein the second connector and a fourth connector have a height of less than or equal to 4 mm.

5. The converged infrastructure manager of claim 3, wherein the converged infrastructure manager is X86 instruction set compatible.

6. The converged infrastructure manager of claim 1, wherein the circuit board comprises memory signal vias and ground vias and wherein the memory signal vias are interleaved with the ground vias.

7. The converged infrastructure manager of claim 1, wherein each dual in-line memory module comprises eight swapped data groups.

8. The converged infrastructure manager of claim 1, wherein the converged infrastructure manager is to manage servers, enclosures, fabrics, storage through templates and profiles, manage virtual machines and clouds, manage stateless servers, facilitate OS Provisioning and Other embedded management nodes.

9. The converged infrastructure manager of claim 1, wherein the converged infrastructure manager is to manage infrastructure of a first enclosure and further comprises a port that facilitates communication with an enclosure manager of a second enclosure.

10. The converged infrastructure manager of claim 1 further comprising a standoff sandwiched between the circuit board and the solid-state drive to space the solid-state drive from the circuit board by the air gap.

11. A converged infrastructure manager comprising:
a circuit board;
a processor connected to a first side of the circuit board;
a solid state drive connected to the circuit board;
a first connector extending from the first side of the circuit board;
a second connector extending from a second side of the circuit board;
a first dual in-line memory module connected to the first connector;
a second dual in-line memory module connected to the second connector;
a third connector extending from the first side of the circuit board between the processor and the first connector;
a fourth connector extending from the second side of the circuit board directly below the third connector;
a third dual in-line memory module connected to the third connector; and
a fourth dual in-line memory module connected to the fourth connector, wherein the processor has a width and wherein the first dual in-line memory module, the second dual in-line memory module, the third dual in-line memory module and the fourth dual in-line memory module are stacked in a direction perpendicular to the width of the processor and have a collective footprint width less than the width of the processor, such that a width of the converged infrastructure manager is no wider than the width of the processor.

12. The converged infrastructure manager of claim 11, wherein the circuit board comprises memory signal vias and ground vias, wherein the memory signal vias are interleaved with the ground vias.

13. The converged infrastructure manager of claim 11, further comprising a standoff sandwiched between the circuit board and the solid-state drive to space the solid-state drive from the circuit board by the air gap.

14. The converged infrastructure manager of claim 11, wherein the converged infrastructure manager is to manage infrastructure of a first enclosure and further comprises a port that facilitates communication with an enclosure manager of a second enclosure.

* * * * *